US012804872B2

(12) United States Patent
Oishi

(10) Patent No.: US 12,804,872 B2
(45) Date of Patent: Nov. 17, 2026

(54) IMAGE PROCESSING DEVICE, MOUNTING DEVICE, MOUNTING SYSTEM, IMAGE PROCESSING METHOD, AND MOUNTING METHOD

(71) Applicant: FUJI CORPORATION, Chiryu (JP)

(72) Inventor: Nobuo Oishi, Kosai (JP)

(73) Assignee: FUJI CORPORATION, Chiryu (JP)

( * ) Notice: Subject to any disclaimer, the term of this patent is extended or adjusted under 35 U.S.C. 154(b) by 702 days.

(21) Appl. No.: 18/252,220

(22) PCT Filed: Nov. 19, 2020

(86) PCT No.: PCT/JP2020/043242

§ 371 (c)(1),
(2) Date: May 9, 2023

(87) PCT Pub. No.: WO2022/107286

PCT Pub. Date: May 27, 2022

(65) Prior Publication Data

US 2024/0015943 A1 Jan. 11, 2024

(51) Int. Cl.
*B23P 19/00* (2006.01)
*H05K 13/04* (2006.01)
*H05K 13/08* (2006.01)

(52) U.S. Cl.
CPC ..... *H05K 13/0813* (2018.08); *H05K 13/0812* (2018.08)

(58) Field of Classification Search
CPC ....................... H05K 13/0813; H05K 13/0812
See application file for complete search history.

(56) References Cited

U.S. PATENT DOCUMENTS 7,002,676 B2 * 2/2006 Akiyama ......... G01N 21/95684 356/237.2
12,051,188 B2 * 7/2024 Inagaki ..................... G06T 5/50

FOREIGN PATENT DOCUMENTS

JP 2005-50887 A 2/2005

OTHER PUBLICATIONS

Internationals Search Report issued Jan. 19, 2021 in PCT/JP2020/043242 filed on Nov. 19, 2020 therein 3 pages.

* cited by examiner

*Primary Examiner* — Paul D Kim
(74) *Attorney, Agent, or Firm* — Oblon, McClelland, Maier & Neustadt, L.L.P.

(57) ABSTRACT

An image processing device, for use in a mounting device, detects a shape of the main body, positions of protruding sections, a number of the protruding sections, and a distal end portion of the protruding section of the mounting device from a captured image of the protruding section radiated with light from side with respect to the component and the main body radiated with light from below with respect to the component. The image processing device acquires information of the insertion sections, and generates a component model including a contour shape model including the shape and the direction of the main body and a protruding section model including the positions and the number of the protruding sections, and a feature of the distal end portion of the protruding section.

10 Claims, 10 Drawing Sheets

Fig. 3

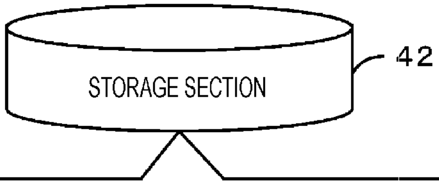

| COMPONENT ID | LIGHTING | CONTOUR SHAPE MODEL | | PROTRUDING SECTION MODEL | | | | | | INSERTION SECTION MODEL | | | |
|---|---|---|---|---|---|---|---|---|---|---|---|---|---|
| | | SHAPE, DIRECTION | SIZE | POSITION | NUMBER | FEATURES OF DISTAL END PORTION | | | REGION | POSITION | NUMBER | FEATURES | SIZE |
| | | | | | | SHAPE | SIZE | SIGNAL LEVEL | | | | | |
| #1 | SIDE | 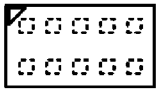 | **×** | (**,**) (**,**) … | 10 | 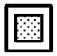 | **×** | DISTAL END PORTION : *** PERIPHERAL SECTION: *** | **** | (**,**) (**,**) … | 10 |  | **×** |
| #2 | VERTICAL | 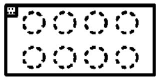 | **×** | (**,**) (**,**) … | 8 |  | *×* | DISTAL END PORTION : *** PERIPHERAL SECTION: *** | ** | (**,**) (**,**) … | 8 |  | *×* |
| #3 | SIDE | 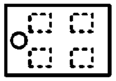 | **×** | (**,**) (**,**) … | 4 | 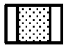 | *×* | DISTAL END PORTION : *** PERIPHERAL SECTION: *** | ** | (**,**) (**,**) … | 4 |  | *×* |
| ⋮ | ⋮ | ⋮ | | ⋮ | | | | | | ⋮ | | | |

Fig. 5
| | SIDE LIGHTING | VERTICAL LIGHTING |
|---|---|---|
| LIGHTING IRRADIATION IMAGE | 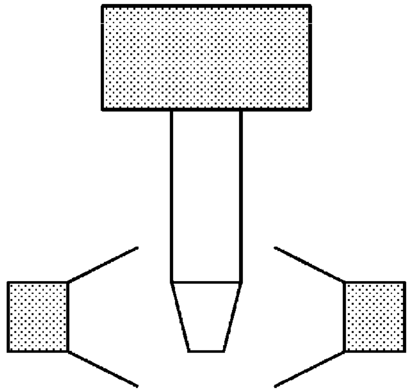 | 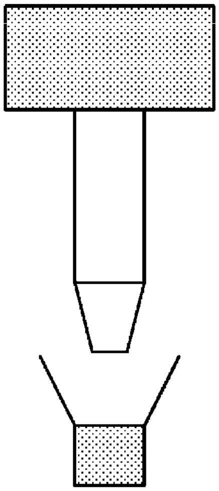 |
| CAPTURED IMAGE | 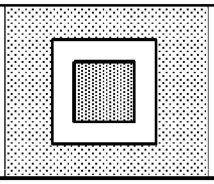 | 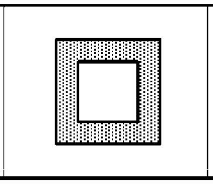 |
| DISTAL END PORTION | BLACK | WHITE |
| TAPER PORTION | WHITE | BLACK |
| RECOGNIZED IMAGE | DISTAL END PORTION  | DISTAL END PORTION  |

IMAGE PROCESSING DEVICE, MOUNTING DEVICE, MOUNTING SYSTEM, IMAGE PROCESSING METHOD, AND MOUNTING METHOD

TECHNICAL FIELD

The present specification discloses an image processing device, a mounting device, a mounting system, an image processing method, and a mounting method.

BACKGROUND ART

In the related art, as a mounting device, a device has been proposed in which an image of an electronic component picked up by a suction nozzle is guided to a camera by a reflective mirror and imaged by a camera (see, for example, Patent Literature 1). In this device, it is possible to provide a configuration capable of reducing the size and cost of a mounting head and the device, and reducing the tact time of production.

PATENT LITERATURE

Patent Literature 1: JP2005-50887A

BRIEF SUMMARY OF THE INVENTION

Technical Problem

However, in the above-described Patent Literature 1, no consideration is given to a process in which a component from which a lead protrudes from a main body is picked up and the lead is inserted into a hole portion formed on a board and mounted. In this manner, it has been desired to more appropriately recognize a component having a main body and a protruding section protruding from the main body and to more appropriately dispose the same on a processing target object such as a board.

In view of such problems, a main object of the present disclosure is to provide an image processing device, a mounting device, a mounting system, an image processing method, and a mounting method capable of executing a mounting process more reliably with a simpler configuration when mounting a component including a protruding section protruding from a main body.

Solution to Problem

The present disclosure employs the following means in order to achieve the above main object.

The image processing device of the present disclosure is an image processing device for use in a mounting device including a mounting section configured to insert one or more protruding sections of a component, which includes a main body and the protruding sections formed on the main body, into insertion sections formed on a processing target object to dispose the component on the processing target object, the image processing device including:

an image control section configured to acquire a captured image obtained by imaging the component by side lighting and/or vertical lighting of an imaging unit including a lighting section and an imaging section, the lighting section being configured to turn on the side lighting for irradiating the component with light from side and the vertical lighting for irradiating the component with light from below, and the imaging section being configured to have at least a depth of field of a distance between the main body and the protruding section and image the component from below, detect a shape of the main body, positions of the protruding sections, the number of the protruding sections, and a distal end portion of the protruding section from the acquired captured image, acquire information of the insertion sections, and generate a component model including a contour shape model and a protruding section model, the contour shape model including the shape and a direction of the main body, and the protruding section model including the positions and the number of the protruding sections, a feature of the distal end portion.

This image processing device detects a shape of the main body, positions of the protruding sections, the number of the protruding sections, and a distal end portion of the protruding section from an image captured by at least one of side lighting for irradiating the component with light from side and vertical lighting for irradiating the component from below, acquires information of the insertion sections, and generates a component model including a contour shape model including the shape and the direction of the main body and a protruding section model including the positions and the number of the protruding sections, and the features of the distal end portion of the protruding section. In this image processing device, for example, it is possible to obtain a captured image in which the protruding section and the main body can be more reliably detected by the side lighting from side and the vertical lighting from below without requiring a special lighting section or an imaging section configured to irradiate the distal end portion of the protruding section with a laser beam to focus on this distal end portion and image the distal end portion. In this image processing device, a component model serving as reference data of a component can be constructed by using the captured image obtained in this manner. The mounting device can then execute recognition of the component having the protruding section by using the component model, and execute the mounting process. Accordingly, in this image processing device, when mounting a component having a protruding section protruding from the main body, it is possible to execute the mounting process more reliably with a simpler configuration.

BRIEF DESCRIPTION OF DRAWINGS

FIG. 3 is an explanatory view illustrating an example of the information stored in storage section 42.

FIG. 5 is an explanatory view illustrating a difference in a captured image obtained by side lighting and vertical lighting.

DESCRIPTION OF EMBODIMENTS

Figure 1:
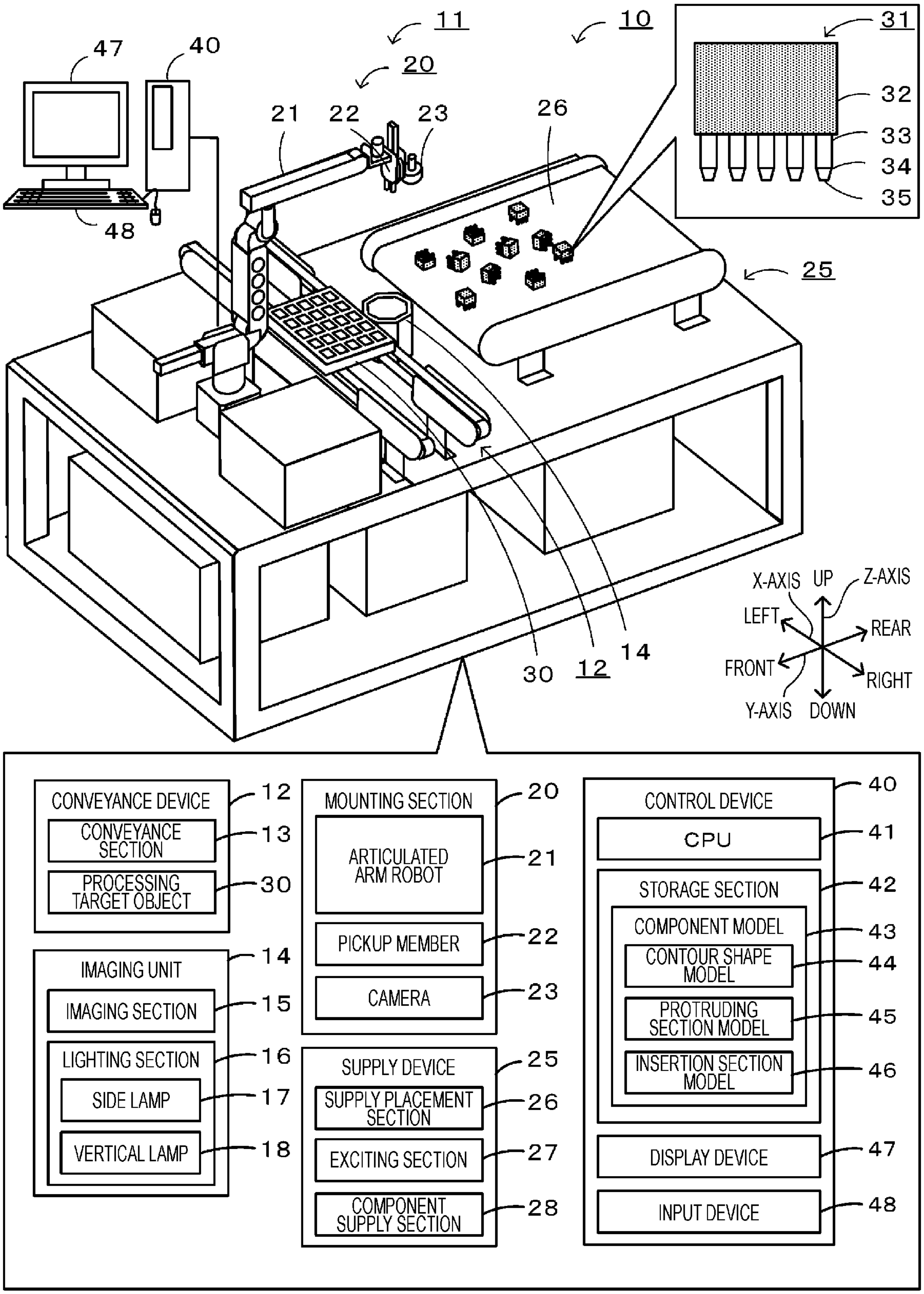
FIG. 1 is a schematic explanatory view illustrating an example of mounting system 10.
Figure 2:
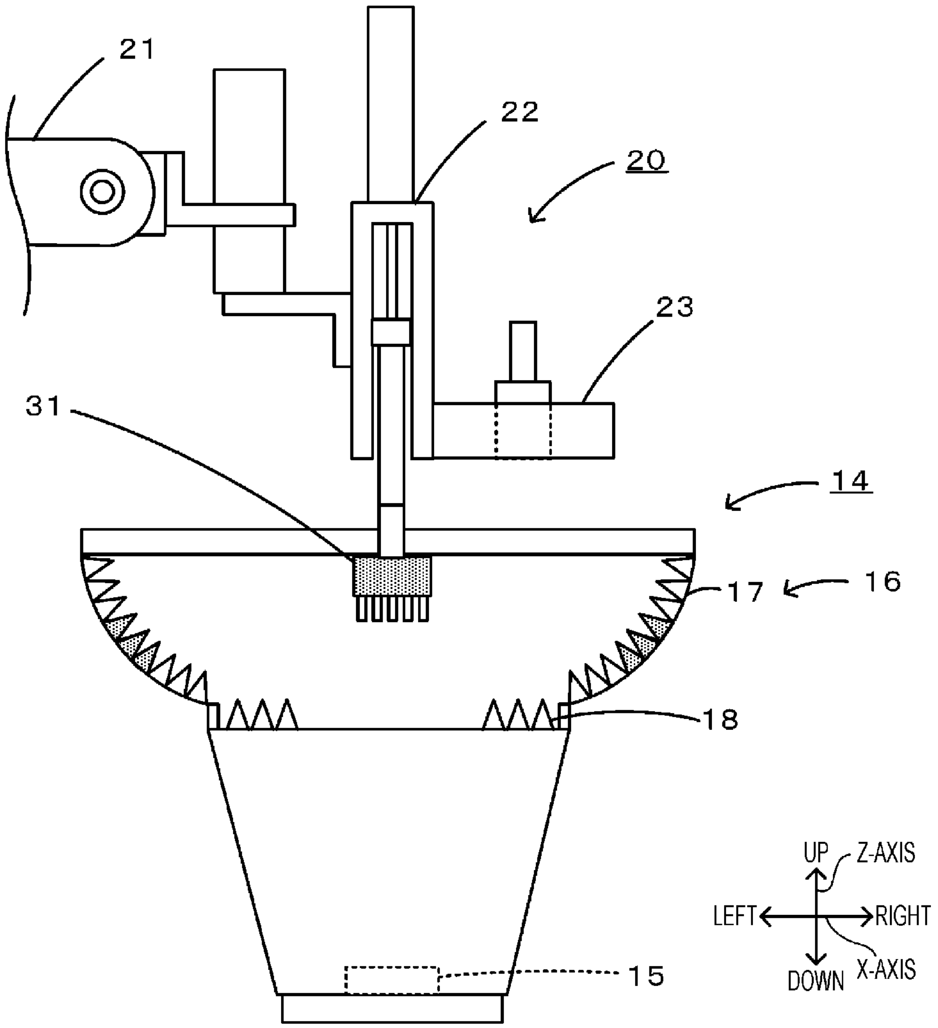
FIG. 2 is a schematic explanatory view illustrating an example of imaging unit 14.

Hereinafter, the present embodiment will be described with reference to drawings. FIG. 1 is a schematic explanatory view illustrating an example of mounting system 10 of the present disclosure. FIG. 2 is a schematic explanatory view illustrating an example of imaging unit 14. FIG. 3 is an explanatory view illustrating an example of the information stored in storage section 42. In the present embodiment, a left-right direction (X-axis), a front-rear direction (Y-axis), and an up-down direction (Z-axis) are as illustrated in FIGS. 1 and 2.

Mounting system 10 is, for example, a device configured to execute a mounting process for mounting component 31 on processing target object 30, and includes mounting device 11 and supply device 25. Mounting device 11 includes conveyance device 12, imaging unit 14, mounting section 20, and control device 40. Processing target object 30 is not particularly limited as long as the object includes an insertion section into which protruding section 33 of component 31 is inserted, and examples thereof include a board and a base material (three-dimensional object) having a three-dimensional shape.

Component 31 is an electronic component, and includes main body 32 and protruding section 33. Protruding section 33 is a terminal pin, and multiple protruding sections 33 are formed on main body 32. Protruding section 33 of component 31 is inserted into and fixed to the insertion section of processing target object 30. Taper portion 34 having a taper surface which is formed thin toward the distal end thereof and distal end portion 35 which is a distal end surface are formed on the distal end side of protruding section 33. Taper portion 34 is formed, for example, so that protruding section 33 can be easily inserted into the insertion section of processing target object 30. This taper portion 34 is appropriately formed in a shape suitable for the shape of protruding section 33, such as a plane or a curved surface, depending on the component type. In addition, in component 31, when the terminal serving as protruding section 33 has a polarity, a mark for defining the direction of main body 32 is formed on the lower surface of main body 32 (see contour shape model 44 in FIG. 3). For convenience of description, protruding section 33 will be hereinafter also referred to as a "terminal" or a "pin".

Conveyance device 12 is a unit configured to carry in and convey processing target object 30, to fix processing target object 30 at a mounting position, and to carry out processing target object 30. Conveyance device 12 conveys processing target object 30 by a pair of conveyor belts provided at intervals.

Imaging unit 14 is a device configured to capture the image of the lower surface side of component 31 in the state of being picked up and held by mounting section 20. Imaging unit 14 is disposed between conveyance device 12 and supply device 25. This imaging unit 14 includes imaging section 15 and lighting section 16. As illustrated in FIG. 2, the imaging range of imaging section 15 is above imaging section 15. Imaging section 15 includes an imaging element such as a CMOS image sensor or a CCD image sensor that generates charges in response to receiving light and outputs the generated charges. Imaging section 15 has at least a depth of field of a distance between main body 32 and protruding section 33. Lighting section 16 irradiates component 31 held by mounting section 20 with light, and is a light source capable of adjusting the brightness (light amount) of light with which component 31 is irradiated, the wavelength of light, the irradiation position of light, and the like. Lighting section 16 includes at least side lamp 17 that irradiates component 31 with light from side, and vertical lamp 18 that irradiates component 31 with light from below. This lighting section 16 is configured to turn on side lamp 17 and vertical lamp 18 simultaneously or separately. In addition, lighting section 16 is configured to simultaneously light respective subjects of the distal ends of protruding sections 33 and main body 32 having different distances from imaging section 15. This imaging unit 14 is configured to image main body 32 and protruding section 33 by the side lighting with side lamp 17 and to image main body 32 and protruding section 33 by the vertical lighting with vertical lamp 18 without the movement of component 31 (see FIG. 2). Imaging unit 14 can also simultaneously turn on side lamp 17 and vertical lamp 18 to image main body 32 and protruding sections 33 as subjects. When articulated arm robot 21 holding component 31 stops above imaging section 15 or is moving, imaging unit 14 images component 31, and outputs the captured image to control device 40. Based on the captured image, control device 40 can inspect whether the shape and the section of component 31 are normal and detect the deviation amount in the position and the rotation of component 31 when picked up.

Mounting section 20 is a device configured to dispose component 31 on processing target object 30. Mounting section 20 includes articulated arm robot 21, pickup member 22, and camera 23. Articulated arm robot 21 is a work robot that connects a first arm and a second arm that pivot about a pivot axis. Pickup member 22 is a member for performing work of picking up component 31 and disposing the same in processing target object 30, and is pivotably connected to the distal end of articulated arm robot 21. Pickup member 22 may be, for example, a nozzle for suctioning and picking up component 31 by negative pressure, or a mechanical chuck for physically gripping and picking up component 31. Camera 23 images downward, and is used, for example, when imaging component 31 placed on supply device 25 and recognizing the posture of component 31 or the like. This camera 23 is fixed to the distal end of articulated arm robot 21.

Supply device 25 is a device configured to supply component 31. Supply device 25 includes supply placement section 26, exciting section 27, and component supply section 28. Supply placement section 26 is configured as a belt conveyor that places component 31 having a placement surface and having an indefinite posture, and moves the same in the front-rear direction. Exciting section 27 applies vibration to supply placement section 26 to change the posture of component 31 on supply placement section 26. Component supply section 28 is disposed at a rear upper portion of supply placement section 26 (not illustrated), and is a device that accommodates component 31 and supplies the same to supply placement section 26. Component supply section 28 releases component 31 to supply placement section 26 periodically or if the number of components on the placement surface is less than a predetermined number. Mounting section 20 recognizes component 31 having the posture that can be picked up and disposed on supply placement section 26 by using articulated arm robot 21, pickup member 22, and camera 23, and picks up the same.

Control device 40 includes a microprocessor centered on CPU 41, and controls the entire device including conveyance device 12, imaging unit 14, mounting section 20, supply device 25, and the like. CPU 41 has both a function of an image control section in the image processing device that performs image processing of imaging unit 14 and a function of a mounting control section in the mounting device that controls articulated arm robot 21. This control device 40 outputs a control signal to conveyance device 12, imaging unit 14, mounting section 20, and supply device 25, while inputting signals from conveyance device 12, imaging unit 14, mounting section 20, and supply device 25. In addition to CPU 41, control device 40 includes storage section 42, display device 47, and input device 48. Storage section 42 is a large-capacity storage medium such as an HDD or a flash memory that stores various application programs and various data files. Display device 47 is a display configured to display information relating to mounting system 10, various input screens, and the like. Input device 48 includes a keyboard, a mouse, and the like input by an operator.

Storage section 42 stores, for example, mounting condition information as a mounting job for mounting component 31 on processing target object 30, component model 43 used for recognizing component 31, and the like. The mounting condition information includes information such as the disposition positions and the number of components 31 to be disposed on processing target object 30. Component model 43 is reference data of component 31, and includes component ID, a lighting method, contour shape model 44, protruding section model 45, insertion section model 46, and the like, as illustrated in FIG. 3. Component ID is identification information for specifying component 31, and is assigned to each type of component 31 in advance. The lighting method is information for specifying a lighting method when a captured image for generating component model 43 is captured, and is at least one of the side lighting and the vertical lighting. Contour shape model 44 is reference data for defining main body 32. Contour shape model 44 defines the shape of main body 32, the direction (the polarity of the terminal), the size of main body 32, and the like. Contour shape model 44 also includes the shape, the disposition position, and the like of a mark that defines the direction of main body 32. Protruding section model 45 is reference data for defining protruding section 33 such as a terminal. Protruding section model 45 includes the positions of protruding sections 33 including the pitch of protruding sections 33, the number of protruding sections 33, the features of the distal end portions, and the like. The features of the distal end portion include, for example, the shape of distal end portion 35, the size thereof, and the signal level. Examples of the shape of the distal end portion include a circle, a square, a rectangle, a trapezoid, and any other shape. The size includes information such as a radius (circle), a width/height (rectangle), a width 1/width 2/height (trapezoid), and a width/height. The signal level includes a signal level at a distal end portion when imaging is performed by predetermined lighting, a signal level at the peripheral section thereof, and the like. Protruding section model 45 further includes information on the size of protruding section 33 and protruding section region A including one or more protruding sections 33 disposed in main body 32, and the like. Insertion section model 46 is reference data that defines an insertion section which is formed on processing target object 30 and into which protruding section 33 is inserted. Insertion section model 46 includes information such as the positions of the insertion sections including the pitch of the insertion sections, the number of the insertion sections, the features including the shape of the insertion section, and the size thereof.

Figure 4:
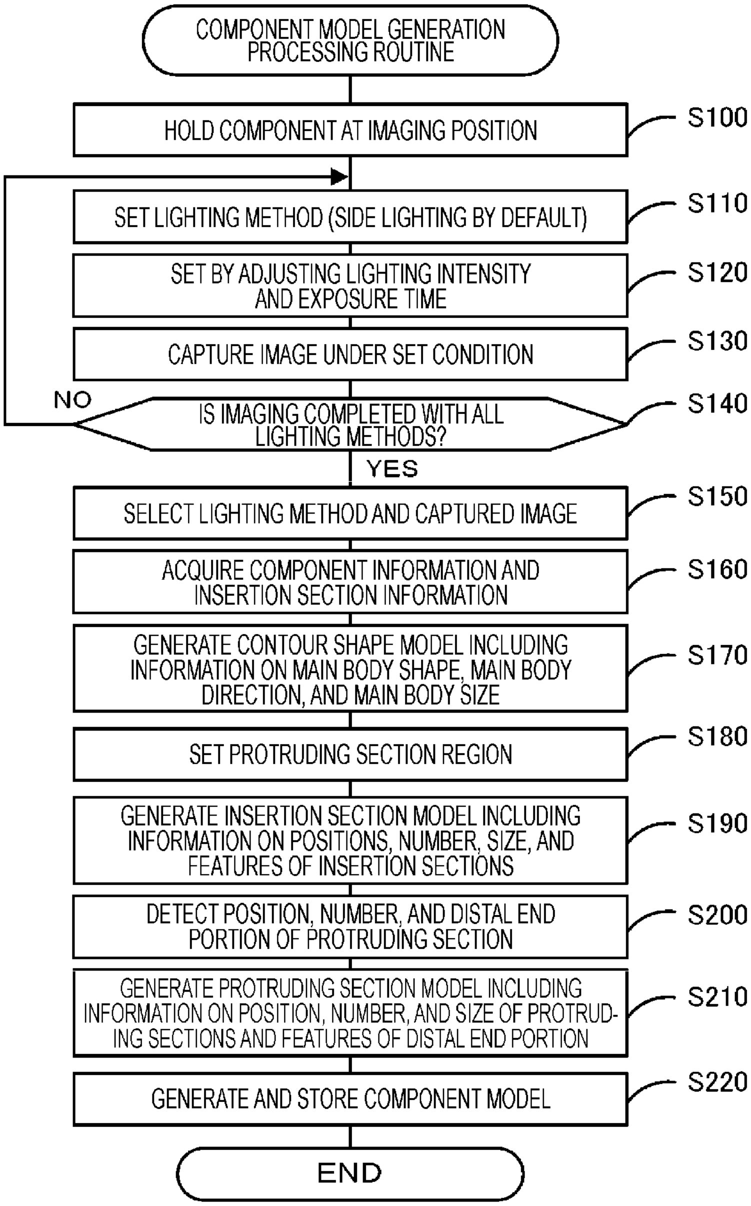
FIG. 4 is a flowchart illustrating an example of a component model generation process routine.

Next, operations of mounting system 10 of the present embodiment configured in this manner, first, processing by control device 40 generating component model 43 will be described. FIG. 4 is a flowchart illustrating an example of a component model generation process routine executed by CPU 41. This routine is stored in storage section 42 and executed before using component 31. When this routine is started, first, CPU 41 causes articulated arm robot 21 to hold component 31 at the imaging position (S100), and sets the lighting method of lighting section 16 (S110). CPU 41 sets the initial value for the side lighting and the next value for the vertical lighting in the lighting method. Next, CPU 41 adjusts and sets the lighting intensity and the exposure time of imaging unit 14 so that a contrast is generated between taper portion 34 and distal end portion 35 (S120). Next, CPU 41 images component 31 under a set condition (S130), determines whether component 31 is imaged by all lighting methods (S140), and performs the processing from S110 onward when the imaging is not performed by all lighting methods. That is, the lighting method is changed to the vertical lighting, and component 31 is imaged by determining the lighting intensity and the exposure time so that a contrast is generated in taper portion 34 and distal end portion 35. In S110, component 31 may be further imaged by a lighting method of simultaneously turning on the side lighting and the vertical lighting. Concurrent lighting may improve detection efficiency.

FIG. 5 is an explanatory view illustrating a difference in a captured image obtained by the side lighting and the vertical lighting. As illustrated in FIG. 5, when protruding section 33 is imaged by the side lighting, a captured image in which taper portion 34 is white (bright section) and distal end portion 35 is black (dark section) is obtained by reflection of the lighting. On the other hand, when protruding section 33 is imaged by the vertical lighting, a captured image in which taper portion 34 is black (dark section) and distal end portion 35 is white (bright section) is obtained by reflection of the lighting. In an electronic component with a lead such as component 31, in most cases, image acquisition in which the side lighting recognizes the distal end portion of protruding section 33 is effective, but the vertical lighting may be good at some components or during calibration, and imaging unit 14 is configured to acquire a captured image by at least one of the two lights.

CPU 41 then selects a lighting method and a captured image suitable for image recognition of component 31 (S150). For example, CPU 41 may select a captured image that is easy to detect distal end portion 35 of protruding section 33 among the captured images of the side lighting and the vertical lighting. For example, CPU 41 may be configured to select a captured image in which an edge portion (a region of taper portion 34) of distal end portion 35 of protruding section 33 is easily distinguished from main body 32. That is, CPU 41 may select a lighting method and a captured image in consideration of the contrast with main body 32 in addition to the contrast between taper portion 34 and distal end portion 35. Alternatively, in S150, the operator may select a suitable lighting method and a captured image.

CPU 41 then acquires component information and insertion section information (S160). The component information is information provided by a manufacturer of component 31, and includes, for example, information such as the size, the shape, and the direction of main body 32, the positions and the number of protruding sections 33, and the pitch (distance) between the multiple protruding sections. It is assumed that the position of protruding section 33 also includes information such as the number of rows/columns, the row/column pitch, and the like. The component information does not include information such as the shape of the distal end of protruding section 33. In addition, the insertion section information is information provided by a manufacturer of processing target object 30, and includes, for example, information such as the positions, the number, the shapes, the sizes, and the like of the insertion sections, and more specifically, information such as the hole diameter, the number of rows/columns, the number of pins, the number of excluded pins, the column pitch, the row pitch, and the like. CPU 41 may be configured to acquire the component information and the insertion section information using provided data, may be configured to acquire it by extracting from CAD data, or may be configured to acquire data input from a specification by the operator.

Next, CPU 41 generates contour shape model 44 including the information of the shape and the direction of main body 32 and further including the information of the size by using the captured image (S170). When generating contour shape model 44, CPU 41 may use the component information. In addition, it is assumed that CPU 41 extracts features such as marks indicating the polarity and the direction of main body 32 as contours. Next, CPU 41 sets protruding section region A so as to surround a portion where distal end portion 35 of protruding section 33 is present (S180, see FIG. 7C described later). CPU 41 sets protruding section region A by providing a predetermined margin for a region where protruding section 33 is present by using the position information of protruding section 33. For example, the predetermined margin can be determined as a value by empirically obtaining the value that can further suppress erroneous detection of protruding section 33. Next, CPU 41 generates insertion section model 46 including the positions and the number of the insertion sections, and the size of the hole of the insertion section and including features such as a shape based on the insertion section information (S190).

Subsequently, CPU 41 detects the positions, the number, and the distal end portions of protruding sections 33 from the captured image, further analyzes the features (S200), and generates protruding section model 45 including the positions and number of protruding sections 33, the information of the features of distal end portion 35, and further including the size information based on the analyzed information (S210). When generating protruding section model 45, CPU 41 may use the component information. In addition, CPU 41 may assign a number to detected protruding section 33 in S200. In addition, it is assumed that the position of protruding section 33 includes information such as the number of rows/columns, the row/column pitch, and the like. In addition, the features of distal end portion 35 may include the shape (circle, square, rectangle, trapezoid, and the like) of distal end portion 35 and the size thereof, the signal level of the distal end portion and the peripheral region thereof, and the like. Then, CPU 41 associates the lighting method of the captured image, contour shape model 44, protruding section model 45, and insertion section model 46 with component ID, generates component model 43 (see FIG. 3), stores the same in storage section 42 (S220), and ends the routine. In this manner, control device 40 can generate component model 43 as the basic data and the shape template of component 31 by using mounting system 10.

Figure 6:
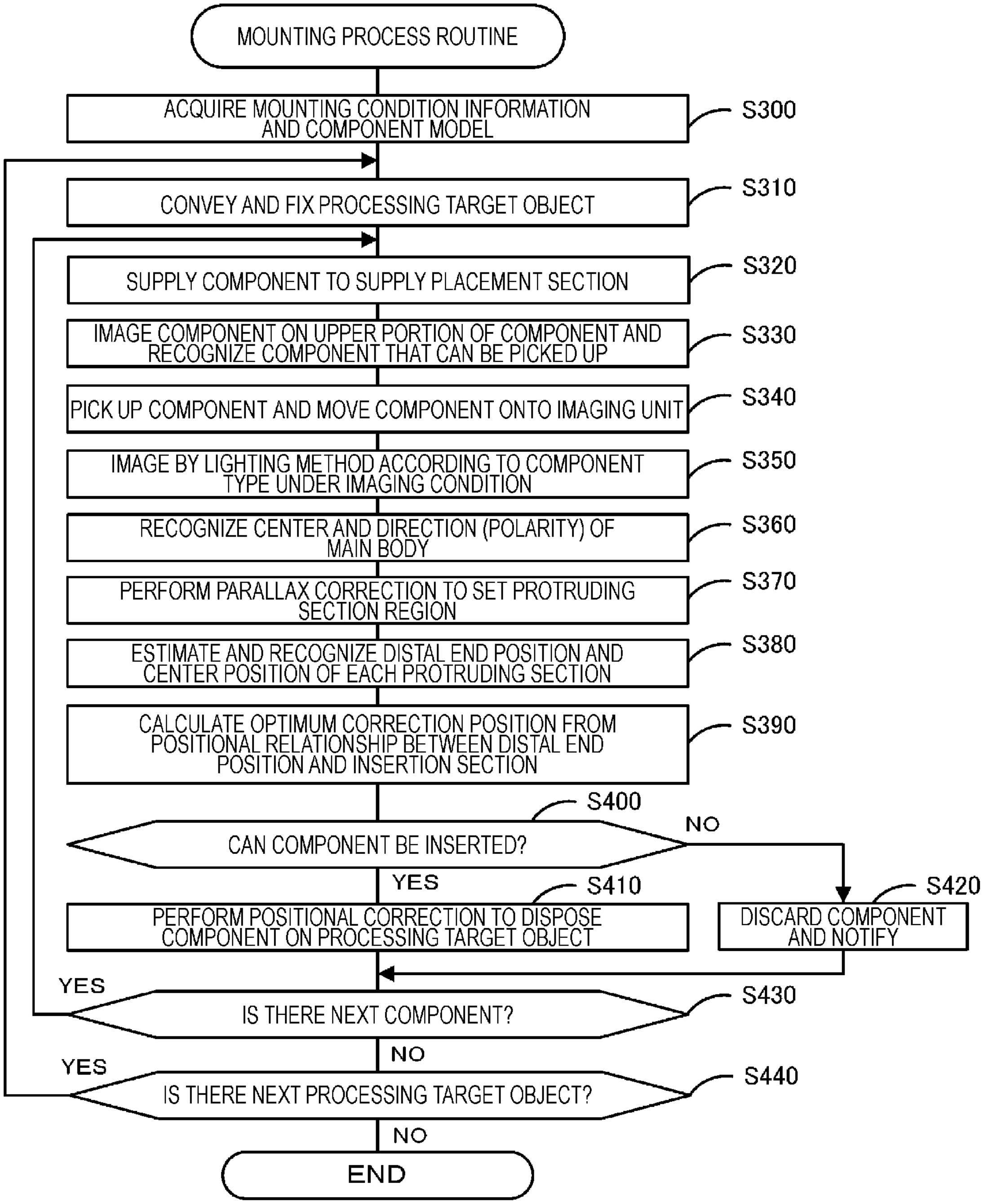
FIG. 6 is a flowchart illustrating an example of a mounting process routine.
Figure 7:
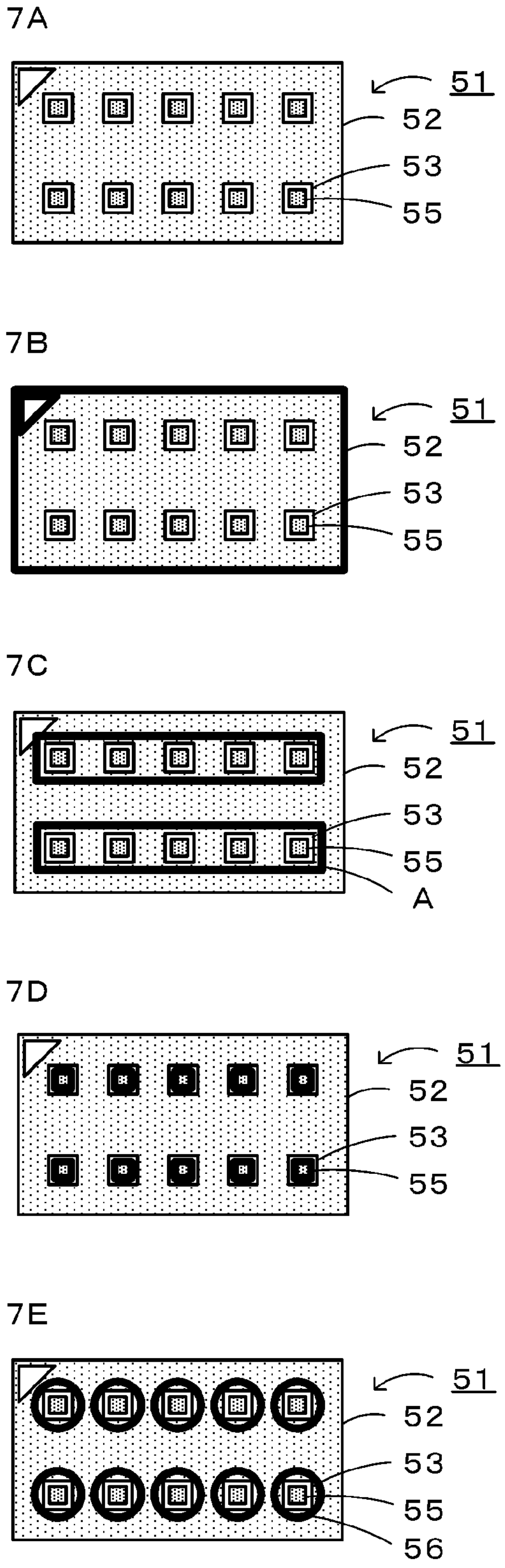
FIG. 7 is an explanatory view illustrating an outline of image recognition processing.

Next, the mounting process for inserting protruding section 33 into the insertion section of processing target object 30 and disposing component 31 by using component model 43 will be described. FIG. 6 is a flowchart illustrating an example of a mounting process routine executed by CPU 41. FIG. 7 is an explanatory view illustrating an outline of the image recognition processing of component 31, in which FIG. 7A is an explanatory view of component image 51, FIG. 7B is a contour shape recognition processing of main body 52, FIG. 7C is a setting of protruding section region A, FIG. 7D is recognition of distal end portion 35, and FIG. 7E is an explanatory view to which the insertion section is applied. The mounting process routine is stored in storage section 42 and executed by a start instruction by the operator.

When this routine is started, first, CPU 41 reads and acquires the mounting condition information and component model 43 (S300). Next, CPU 41 causes conveyance device 12 to convey processing target object 30 to the mounting position, and to perform fixing processing (S310), and causes component supply section 28 to supply component 31 to supply placement section 26 (S320). Next, CPU 41 controls articulated arm robot 21, moves camera 23 above supply placement section 26, causes camera 23 to image component 31 on supply placement section 26, and performs processing for recognizing component 31 that can be picked up (S330). CPU 41 recognizes, as a component that can be picked up, component 31 in which protruding section 33 is located on the lower side and main body 32 is located on the upper side among components 31 on supply placement section 26. In addition, when there is no component 31 that can be picked up, exciting section 27 is driven to change the posture of component 31. In addition, when component 31 is not present on supply placement section 26, component supply section 28 is driven to supply component 31 onto supply placement section 26.

Next, component 31 drives articulated arm robot 21 and pickup member 22, causes pickup member 22 to pick up component 31, and moves the same to the upper portion of imaging unit 14 (S340). Mounting section 20 adjusts the imaging position and the control of articulated arm robot 21 in advance so that the center position of pickup member 22 moves to the center of the image. Next, CPU 41 causes imaging unit 14 to image component 31 from protruding section 33 side under an imaging condition including the lighting method corresponding to the component type (S350). CPU 41 acquires the lighting method and the imaging condition from component model 43. Next, CPU 41 extracts the region of component 31 from the captured image (FIG. 7A), and recognizes the center position of main body 32 and the direction (polarity) of main body 32 (S360). As illustrated in FIG. 7A, component image 51 includes main body 52, protruding section 53, distal end portion 55, and the like as images. The region of component 31 can be extracted by pattern matching of contour shape model 44. The direction of main body 32 can be recognized by detecting a shape feature capable of recognizing a mark or a direction and performing pattern matching (FIG. 7B). Next, CPU 41 executes parallax correction by using the detected center position of component 31 to set the position of protruding section region A (S370).

Figure 8:
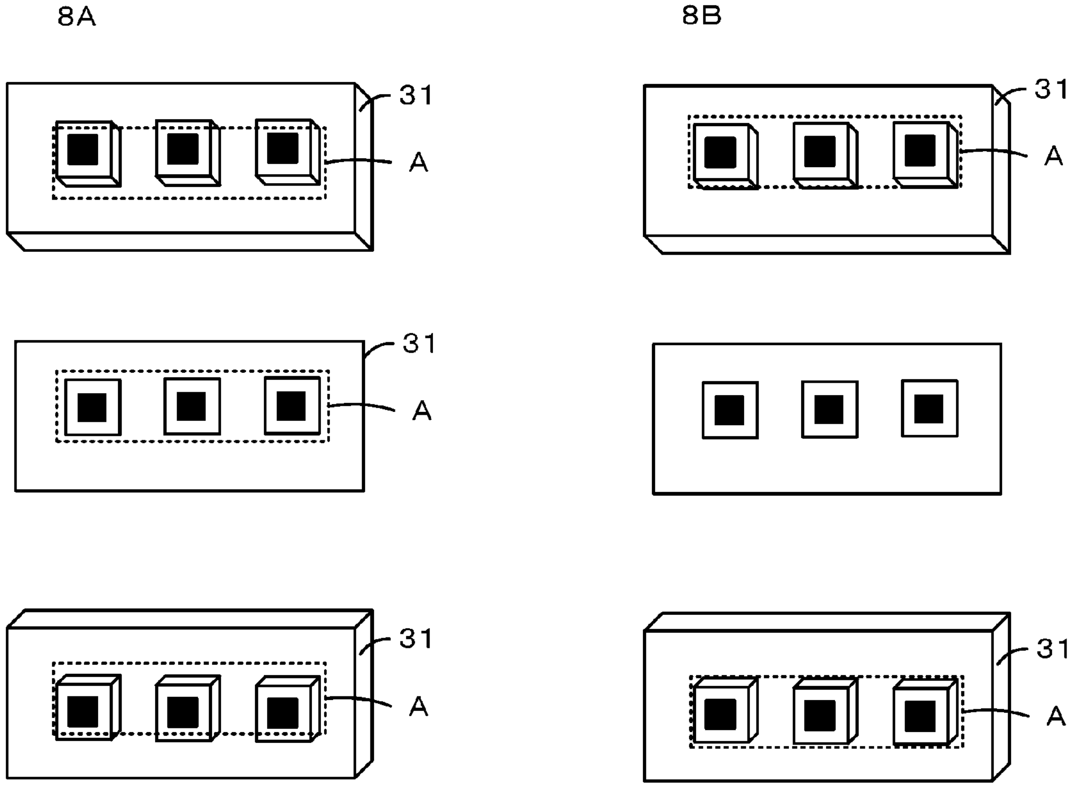
FIG. 8 is an explanatory view for correcting a setting position of protruding section region A in consideration of parallax.
Figure 9:
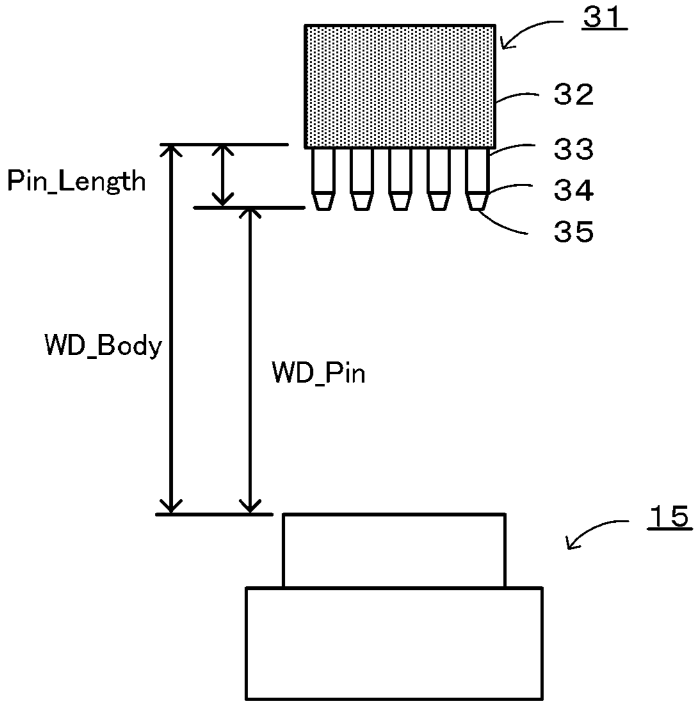
FIG. 9 is an explanatory view of a length of a protruding section and a distance between component 31 and imaging section 15.

FIG. 8 is an explanatory view for correcting the setting position of protruding section region A in consideration of the parallax, in which FIG. 8A is an explanatory view before the parallax correction and FIG. 8B is an explanatory view after the parallax correction. FIG. 9 is an explanatory view of the length of the protruding section and the distance between component 31 and imaging section 15. In component 31, as illustrated in FIG. 9, since the distance between imaging section 15 and main body 32 is longer than the distance between imaging section 15 and distal end portion 35, as illustrated in FIG. 8, parallax occurs so that the side faces of main body 32 and protruding section 33 can be seen when component 31 deviates from the image center. When component 31 is at the image center, there is no problem, but when in the image peripheral section, the position of distal end portion 35 deviates with respect to main body 32. If protruding section region A is set in this state, distal end portion 35 cannot be detected appropriately in some cases. CPU 41 executes parallax correction on the captured image with the image center as a reference, sets protruding section region A on component image 51, and then detects the position of protruding section 33. In the parallax correction, CPU 41 executes parallax correction of Rp−Ru×PL when resolution (μm/pixel) per pixel of distal end portion 35 of protruding section 33 is defined as Rp, unit resolution (μm/pixel) that is a resolution change amount per predetermined length is defined as Ru, and length (mm) of protruding section 33 from main body 32 is defined as PL (FIG. 8B). By executing such parallax correction, CPU 41 can recognize distal end portion 35 more reliably.

Next, CPU 41 performs processing for estimating and recognizing the position of distal end portion 35 of each protruding section 33 and the center position of distal end portion 35 in the region inside protruding section region A (S380). CPU 41 can recognize the position of distal end portion 35 by performing pattern matching in protruding section region A by using protruding section model 45. Protruding section model 45 includes information as to the positions and the number of protruding sections 33, and CPU 41 can estimate the approximate position of distal end portion 35 (see FIG. 3). In addition, since the shape feature of distal end portion 35 is included in component model 43, CPU 41 automatically generates a shape model and performs pattern matching by using the same. At this time, since there is an individual difference in the shape, the size, and the signal level for each distal end portion 35, CPU 41 performs pattern matching while changing these parameters. In particular, with respect to the shape, in some cases, a rectangle has a higher matching score in another individual even if a circle has a high a matching score in an individual in model generation. For this reason, when the number of protruding sections 33 described in protruding section model 45 cannot be detected, CPU 41 may generate a shape model of another shape and perform pattern matching again to improve the recognition rate. When detecting the positions of all distal end portions 35, CPU 41 calculates the center positions of all distal end portions 35.

When the center position of distal end portion 35 is detected, CPU 41 calculates an optimum correction position from the positional relationship between the center position of distal end portion 35 and the insertion section (S390). CPU 41 obtains a correction value from the positional relationship between the pitch of the position of distal end portion 35, the variation amount of the position, and the hole of the insertion section. More specifically, CPU 41 measures the distance between the center position of each distal end portion 35 and the hole of the insertion section, and sets the position where the maximum value of the distance is minimized as the optimum correction value. Next, CPU 41 determines whether this component 31 can be inserted into the insertion section (S400). Distal end portions 35 of protruding sections 33 are not always arranged at an equal pitch due to, for example, protruding section 33 being bent. CPU 41 calculates the distance between the hole of the insertion section and the outer shape of the distal end of protruding section 33, and determines that component 31 can be inserted when the distance between all protruding sections 33 and the hole is equal to or larger than a predetermined allowable threshold value. This allowable threshold value is empirically required, for example, as a value at which protruding section 33 does not interfere with the inner wall of the insertion section.

Figure 10:
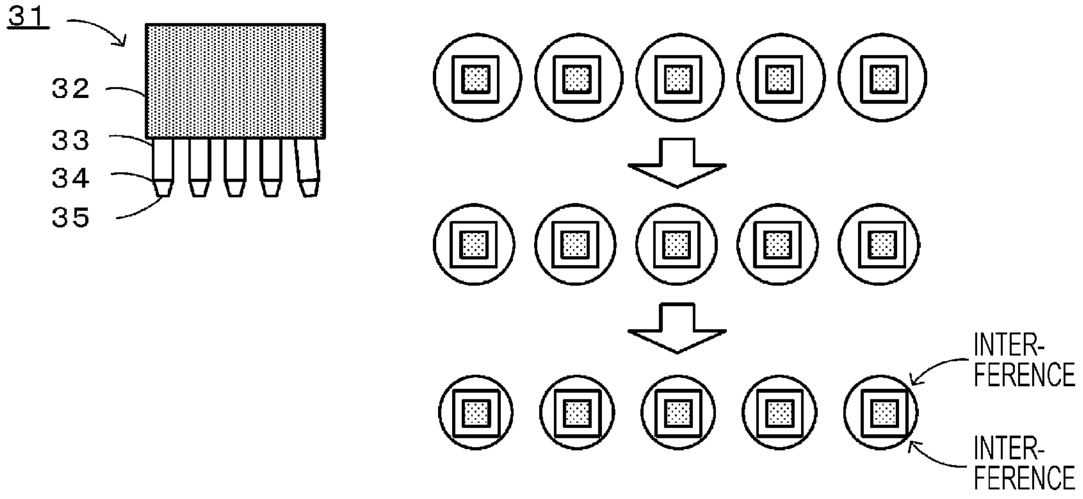
FIG. 10 is an explanatory view illustrating an example of insertion possibility determination using insertion section model 46.

FIG. 10 is an explanatory view illustrating an example of the insertion possibility determination using insertion section model 46. In a state in which the correction value is applied, as illustrated in FIG. 10, CPU 41 checks the interference between the hole and distal end portion 35 of protruding section 33 while reducing the hole diameter of insertion section model 46 from a standard hole diameter, and can make this determination based on whether the difference between the hole diameter and the standard hole diameter when the hole and distal end portion 35 interfere with each other exceeds the allowable threshold value. As described above, CPU 41 determines whether protruding section 33 interferes with the insertion section when protruding section is inserted into the insertion section at least assuming the insertion sections having a first size and a second size smaller than the first size.

In S400, when component 31 can be inserted into the insertion section, CPU 41 executes positional correction and causes component 31 to be disposed at a predetermined disposition position of processing target object 30 (S410). At this time, when CPU 41 causes component 31 to be disposed on processing target object 30, protruding section 33 is inserted into the insertion section of processing target object 30 in the same manner as the determination result. On the other hand, in S400, when component 31 cannot be inserted into the insertion section, CPU 41 stops using component 31 and discards the same, and notifies the operator of the message to that effect (S420). As the notification to the operator, for example, a message or an icon indicating that component 31 cannot be inserted is displayed on display device 47.

After S420 or after S410, CPU 41 determines whether there is component 31 to be disposed next (S430), and when there is next component 31, performs the processing from S320 onward. That is, CPU 41 repeatedly performs processing for supplying component 31 to supply placement section 26 as necessary, recognizing component 31 that can be picked up, picking up component 31 and imaging component 31 by imaging unit 14, recognizing distal end portion 35, determining whether distal end portion 35 can be inserted, and disposing it. On the other hand, in S430, when there is no next component to be disposed in processing target object 30, CPU 41 determines whether there is processing target object 30 on which component 31 is to be disposed next (S440), and when there is next processing target object 30, performs the processing from S310 onward. That is, CPU 41 discharges processing target object 30 on which component 31 is disposed, carries in next processing target object 30, and performs the processing from S320 onward. On the other hand, when there is no next processing target object 30 in S440, CPU 41 ends the routine.

A correspondence relationship between constituent elements of the present embodiment and constituent elements of the present disclosure will be clarified. CPU 41 of the present embodiment corresponds to an image control section and a mounting control section of the present disclosure, mounting section 20 corresponds to a mounting section, imaging section 15 corresponds to an imaging section, lighting section 16 corresponds to a lighting section, and supply device 25 corresponds to a supply device. In addition, control device 40 corresponds to an image processing device, and mounting device 11 corresponds to a mounting device. In the present embodiment, an example of the image processing method and the mounting method of the present disclosure has also been clarified by describing the operation of mounting system 10.

Control device 40 of the present embodiment described above detects the shape of main body 32, the position of protruding section 33, the number of protruding sections 33, and distal end portion 35 of protruding section 33 from a captured image of protruding section 33 irradiated with light from the side with respect to component 31 and main body 32 irradiated with light from below with respect to component 31 and acquires the information of the insertion section to generate component model 43 including contour shape model 44 including the shape and the direction of main body 32, and protruding section model 45 including the positions and the number of protruding sections 33, and the features of distal end portion 35. In this control device 40, for example, it is possible to obtain a captured image in which protruding section 33 and main body 32 can be more reliably detected by the side lighting from side and the vertical lighting from below without requiring a special lighting section or an imaging section configured to irradiate distal end portion 35 of protruding section 33 with a laser beam to focus on this distal end portion 35 and image distal end portion 35. In this control device 40, it is possible to construct component model 43 serving as reference data of component 31 by using the captured image obtained in this manner. Mounting device 11 can use component model 43 to recognize component 31 having protruding section 33, and perform the mounting process. Accordingly, in this control device 40, when mounting component 31 having protruding section 33 protruding from main body 32, it is possible to perform the mounting process more reliably with a simpler configuration. In addition, control device 40 can generate component model 43 including the information of insertion section model 46 including positions, the number, and sizes of the insertion sections from the information of the insertion section.

Mounting device 11 of the present embodiment detects the shape of main body 32, the positions of protruding sections 33, the number of protruding sections 33, and distal end portion 35 of protruding section 33 from the captured image obtained by at least one of the side lighting and the vertical lighting, contour shape model 44 including the shape and the direction of main body 32, and protruding section model 45 including the positions and the number of protruding sections 33 and the features of distal end portion 35 are generated, insertion section model 46 including positions, the number, and sizes of the insertion sections is generated from the information of the insertion section, and component model 43 including contour shape model 44, protruding section model 45, and insertion section model 46 is generated. In addition, this mounting device 11 detects the shape of main body 32, the positions of protruding sections 33, the number of protruding sections 33, and distal end portion 35 of the protruding section from the acquired captured image of component 31, and causes mounting section 20 to dispose component 31 on processing target object 30 by using component model 43. This mounting device 11 uses the lighting used in generated component model 43 to acquire a captured image obtained by imaging component 31 picked up by mounting section 20, and detects the shape of main body 32, the positions of protruding sections 33, the number of protruding sections 33, and distal end portion 35 of protruding section 33 from the acquired captured image. This mounting device 11 then causes mounting section 20 to dispose component 31 on processing target object 30 by using component model 43. Accordingly, in this mounting device 11, when mounting component 31 having protruding section 33 protruding from main body 32, it is possible to perform the mounting process more reliably with a simpler configuration.

CPU 41 determines whether component 31 can be disposed on processing target object 30 by using component model 43. Depending on the shape of protruding section 33, such as the deformation of protruding section 33, component 31 having protruding section 33 may not be inserted into the insertion section. In this mounting device 11, it is possible to acquire in advance the information that component 31 can be used by using component model 43, and it is possible to perform the mounting process more reliably. Further, CPU 41 determines whether protruding section 33 interferes with the insertion section when protruding section 33 is inserted into the insertion section at least assuming the insertion sections having the first size and the second size smaller than the first size, by using insertion section model 46. In this mounting device 11, by changing the size of the insertion section to be smaller, it is possible to acquire information as to whether component 31 can be used without interfering with the insertion section. Furthermore, CPU 41 executes parallax correction on the captured image with the image center as a reference, and detects the positions of protruding sections 33. In imaging section 15 having at least the depth of field of the distance between main body 32 and protruding section 33, since main body 32 is farther than distal end portion 35 of protruding section 33, parallax occurs more on the image outer peripheral side deviating from the center of the image. In this mounting device 11, by correcting such parallax, it is possible to detect the positions of protruding sections 33 more appropriately, and to use component model 43 more appropriately. At this time, CPU 41 executes parallax correction of the $Rp-Ru \times PL$ when resolution per pixel of distal end portion 35 of protruding section 33 is defined as Rp, unit resolution that is a resolution change amount per predetermined length is defined as Ru, and length of the protruding section from the main body is defined as PL. In this mounting device 11, it is possible to execute more appropriate parallax correction in consideration of the resolution and the length of the protruding section.

Mounting system 10 of the present embodiment includes above-described mounting device 11 and supply device 25 configured to supply component 31 to the placement region in an indefinite direction, and mounting section 20 includes articulated arm robot 21. This mounting system 10 can supply a component having protruding section 31 easily and insert protruding section 33 into processing target object 30 by using general-purpose articulated arm robot 21 to dispose component 31.

In mounting device 11, since imaging section 15 has at least a depth of field of the distance between main body 32 and protruding section 33, main body 32 and protruding section 33 can be imaged on the same image. In addition, CPU 41 can generate more suitable component model 43 because the captured image obtained by at least one of the side lighting and the vertical lighting is selected as the captured image for setting component model 43. At this time, since CPU 41 selects a captured image that is easy to detect distal end portion 35 of protruding section 33 among the captured image of the side lighting and the captured image of the vertical lighting, it is possible to detect distal end portion 35 of protruding section 33 in component 31 by selectively using the side lighting and the vertical lighting. In addition, CPU 41 selects a captured image in which an edge portion of distal end portion 35 of protruding section 33 can be easily distinguished from main body 32 among the image captured by the side lighting and the image captured by the vertical lighting. In this control device 40, the imaging color of the edge portion of distal end portion 35 can be changed by either the side lighting or the vertical lighting, and it is possible to recognize distal end portion 35 of protruding section 33 more reliably by making the imaging color of the edge portion different from the color of main body 32.

Further, CPU 41 generates component model 43 including protruding section region A including one or more protruding sections 33 in protruding section model 45. In this control device 40, since the positions of protruding sections 33 can be handled in units of regions, it is possible to recognize protruding section 33 more efficiently. In addition, since CPU 41 generates contour shape model 44 including the direction of component 31, it is possible to construct component model 43 including the direction of the component main body.

Since mounting system 10 can perform the mounting process for inserting a terminal into an insertion section by using mounting device 11 including articulated arm robot 21 and supply device 25 configured to place component 31 in an indefinite direction, it is possible to perform the complicated mounting process by using the general-purpose device at a relatively low cost. Further, in mounting system 10, since component model 43 can be generated by inputting a small number of parameters, the efforts of image processing setting of the operator can be suppressed to the minimum. Further, in a dedicated device using special laser lighting or a special imaging section having a small depth of field, it is not possible to image distal end portion 35 of protruding section 33 and main body 32 in the same image, but in this mounting system 10, distal end portion 35 and main body 32 can be imaged at once, and distal end portion 35 and the direction of main body 32 can be executed with one image, thereby shortening the processing time. In addition, in mounting system 10, even in component 31 in which the terminal length is varied, distal end portion 35 can be recognized by one time of imaging. In addition, since mounting system 10 recognizes each terminal and measures the distance between the terminals and the like, it is possible to detect and discard defective products such as terminal folding, bending, or the like, thereby further improving efficiency in a production site.

It is needless to say that the present disclosure is not limited to the above-described embodiment, but may be practiced in various forms within the technical scope of the present disclosure.

For example, in the above-described embodiment, control device 40 of mounting device 11 has the function of the image processing device, but the present embodiment is not limited thereto, and an image processing device may be provided separately from mounting device 11. Similarly, in the above-described embodiment, CPU 41 has the functions of an image control section and a mounting control section, but the present embodiment is not limited thereto. An image control section may be provided separately from CPU 41. Also in this mounting device 11, when mounting a component having a protruding section protruding from the main body, it is possible to execute the mounting process more reliably with a simpler configuration.

In the above-described embodiment, the shape and the direction (the polarity of the terminal) of main body 32, the size of main body 32, and the like are defined in contour shape model 44, but the present embodiment is not limited thereto, and may include other factors or may include at least the shape and the direction of main body 32. In addition, in the above-described embodiment, protruding section model 45 includes the positions and the number of protruding sections 33, the features of the distal end portion, the size of protruding section 33, the information of protruding section region A, and the like, but the present embodiment is not limited thereto, and protruding section model 45 may include other factors, or may include at least the positions and the number of protruding section 33, and the features of distal end portion 35. Further, in the above embodiment, insertion section model 46 includes information such as the positions of the insertion sections including the pitch of the insertion section, the number, the features including the shape of the insertion section, the size thereof, and the like, but the present disclosure is not limited thereto, and may include other factors, or may include at least positions, the number, and sizes of the insertion sections. In addition, in the above-described embodiment, component model 43 includes contour shape model 44, protruding section model 45, and insertion section model 46, but the present embodiment is not limited thereto, and for example, insertion section model 46 may be omitted. Component model 43 may appropriately include information that allows protruding section 33 to be inserted into the insertion section.

In the above-described embodiment, when the parallax correction of a captured image is performed, the parallax correction of Rp−Ru×PL is executed by using resolution Rp, unit resolution Ru, and length PL of the protruding section, but the present embodiment is not limited thereto, and the parallax correction may be executed by using other factors in addition to or in place of these factors. Alternatively, CPU 41 may omit the parallax correction. At this time, it is desirable for CPU 41 to perform processing for recognizing distal end portion 35 in a wider range without using protruding section region A.

In the above-described embodiment, CPU 41 generates a component model by using either the image captured by the side lighting or the image captured by the vertical lighting in the generation of the component model, but the present embodiment is not limited thereto, and the component model may be generated from a captured image in which the side lighting and the vertical lighting are simultaneously turned on. In addition, CPU 41 may generate a component model by performing image processing on the image captured by the side lighting, performing image processing on the image captured by the vertical lighting, combining the two image processing results, and finally obtaining one image processing result. CPU 41 may select an appropriate lighting method or image processing method according to component 31. CPU 41 can adopt the same lighting method and image processing method as described above even when image processing is performed on component 31 picked up by mounting section 20 by using the component model.

In the above-described embodiment, protruding section 33 of component 31 is described as a terminal pin, but the present embodiment is not limited thereto as long as the protruding section is a section to be inserted into the insertion section (hole portion) of processing target object 30.

Figure 11:
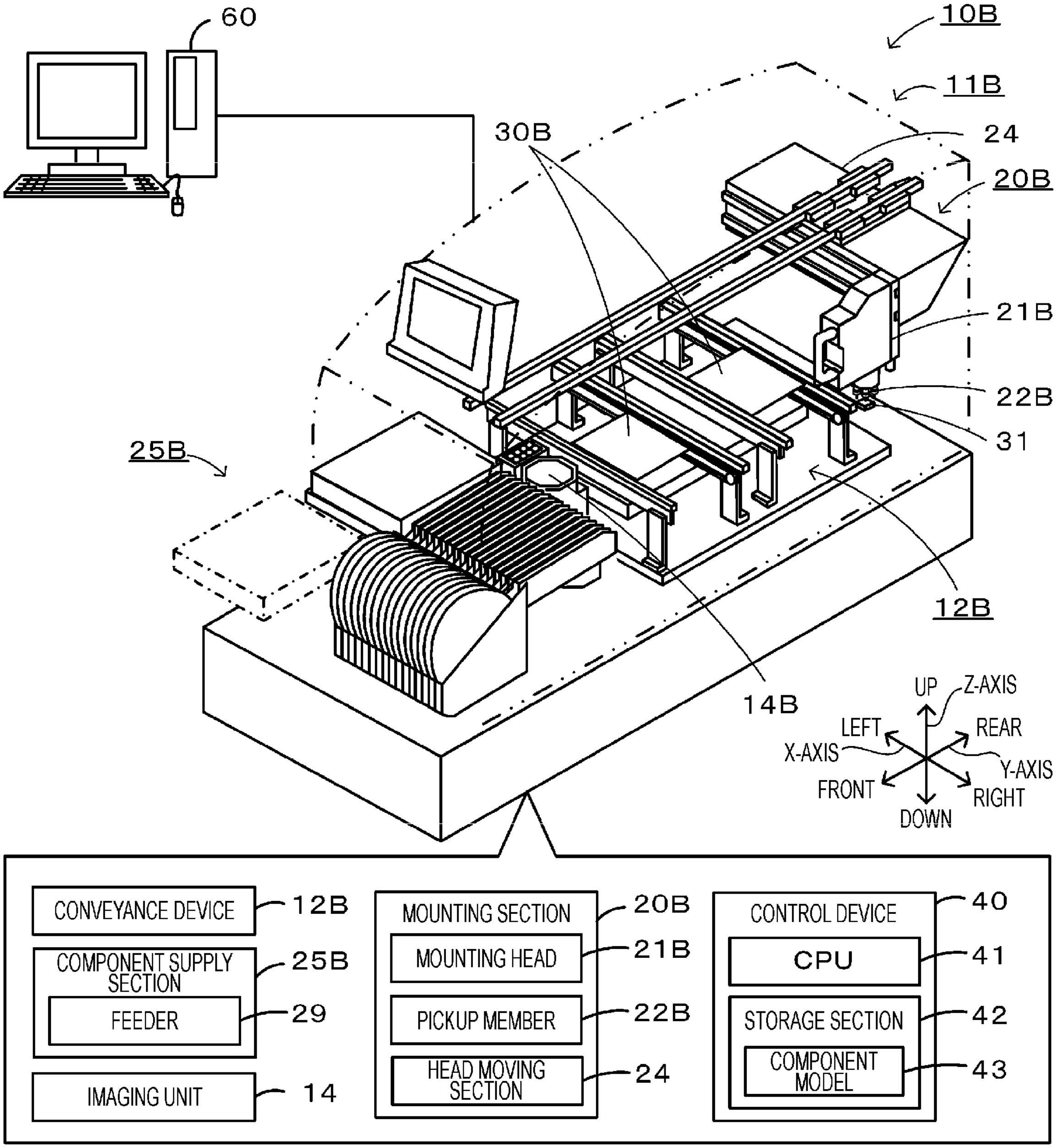
FIG. 11 is an explanatory view illustrating an example of another mounting system 10B.

In the above-described embodiment, it is described that mounting section 20 includes articulated arm robot 21, but the present embodiment is not limited thereto as long as protruding section 33 can be inserted into the insertion section and component 31 can be disposed on processing target object 30, and may have, for example, the configuration of an XY robot. FIG. 11 is an explanatory view illustrates an example of another mounting system 10B. This mounting system 10B includes mounting device 11B and management device 60. Mounting device 11B includes conveyance device 12B configured to convey board 30B, supply device 25B including feeder 29, imaging unit 14 capable of executing side lighting and vertical lighting, mounting section 20B, and control device 40. Mounting section 20B includes mounting head 21B, pickup member 22B attached to mounting head 21B, and head moving section 24 that moves mounting head 21B in the XY directions. Imaging unit 14 and control device 40 are the same as those in the above-described embodiment. Even when such mounting device 11B is used, it is possible to perform the mounting process more reliably with a simpler configuration when mounting a component having a protruding section protruding from the main body.

In the above-described embodiment, the image processing device of the present disclosure is described as control device 40, but the present embodiment is not limited thereto, and may be described as an image processing method or a program for executing the image processing method by a computer. In addition, in the above-described embodiment, the mounting device of the present disclosure is described as mounting device 11, but the present embodiment is not limited thereto, and may be described as a mounting method or a program for executing the mounting method by a computer.

The image processing device and the mounting device of the present disclosure may be configured as follows. For example, in the image processing device of the present disclosure, the image control section may generate a component model further including an insertion section model including positions, the number, and sizes of the insertion sections from the information of the insertion section. In this image processing device, it is possible to generate a component model including the information of the insertion section.

The mounting device of the present disclosure includes:

a mounting section configured to insert one or more protruding sections of a component, which includes a main body and the protruding sections formed on the main body, into insertion sections formed on a processing target object to dispose the component on the processing target object, a lighting section configured to turn on side lighting for irradiating the component with light from side and vertical lighting for irradiating the component with light from below, an imaging section configured to have at least a depth of field of a distance between the main body and the protruding section and image the component from below, and a mounting control section configured to use lighting used in the component model generated by the above-described image processing device to detect a shape of the main body, positions of the protruding sections, the number of the protruding sections, and a distal end portion of the protruding section from a captured image obtained by imaging the component picked up by the mounting section, and causes the mounting section to dispose the component on the processing target object by using the component model generated by the image processing device.

In this mounting device, by using the side lighting and/or the vertical lighting used in the component model generated in the above-described image processing device, a captured image obtained by imaging the component picked up by the mounting section is acquired, and the shape of the main body, the positions of the protruding sections, the number of the protruding sections, and the distal end portion of the protruding section are detected from the acquired captured image. This mounting device then causes the mounting section to dispose this component on the processing target object by using the component model generated by the image processing device. Accordingly, in this mounting device, when mounting a component including a protruding section protruding from the main body, it is possible to perform the mounting process more reliably with a simpler configuration. In addition, in this mounting device, it is possible to obtain an effect corresponding to an aspect in which the above-described image processing device is adopted.

In the mounting device of the present disclosure, the mounting control section may determine whether the component can be disposed on the processing target object by using the component model. In a component including a protruding section, depending on the shape of the protruding section, such as deformation, the component may not be inserted into the insertion section. In this mounting device, it is possible to acquire information that a component can be used in advance by using a component model, and it is possible to perform the mounting process more reliably.

In the mounting device of the present disclosure, the mounting control section may determine whether the protruding section interferes with the insertion section when the protruding section is inserted into the insertion section at least assuming the insertion sections having a first size and a second size smaller than the first size, by using the insertion section model. In this mounting device, by using the size of multiple insertion sections, it is possible to acquire information as to whether the component can be used without interfering with the insertion sections, and it is possible to perform the mounting process more reliably.

In the mounting device of the present disclosure, the mounting control section may execute parallax correction on the captured image with the image center as a reference, and detect the positions of the protruding sections. In the imaging section having at least a depth of field of the distance between the main body and the protruding section, since the main body is farther than the distal end portion of the protruding section, parallax occurs more on the image outer peripheral side deviating from the center of the image. In this mounting device, by correcting such parallax, it is possible to detect the positions of the protruding sections more appropriately, and to use the component model more appropriately. At this time, the mounting control section may execute the parallax correction of $Rp-Ru \times PL$ when resolution per pixel of the distal end portion of the protruding section is defined as Rp, unit resolution that is a resolution change amount per predetermined length is defined as Ru, and length of the protruding section from the main body is defined as PL. In this mounting device, it is possible to execute more appropriate parallax correction in consideration of the resolution and the length of the protruding section.

The mounting system of the present disclosure includes the mounting device according to any one of the above-described mounting devices, and a supply device configured to supplying the component to a placement region in an indefinite direction, in which the mounting section includes an articulated arm robot. In this mounting system, it is possible to easily supply a component having a protruding section, and to dispose the component on a processing target object by using a relatively general-purpose articulated arm robot.

The image processing method of the present disclosure is an image processing method used by a mounting device including a mounting section configured to insert one or more protruding sections of a component, which includes a main body and the protruding sections formed on the main body, into insertion sections formed on a processing target object to dispose the component on the processing target object, the method including:

(a) a step of acquiring a captured image obtained by imaging the component by side lighting and/or vertical lighting of an imaging unit including a lighting section and an imaging section, the lighting section being configured to turn on the side lighting for irradiating the component with light from side and the vertical lighting for irradiating the component with light from below, and the imaging section being configured to have at least a depth of field of a distance between the main body and the protruding section and image the component from below, (b) a step of detecting a shape of the main body, positions of the protruding sections, the number of the protruding sections, and a distal end portion of the protruding section from the acquired captured image, (c) a step of acquiring information of the insertion sections, and (d) a step of generating a component model including a contour shape model, a protruding section model, and an insertion section model, based on the detection result of the step (b) and the information acquired in the step (c), the contour shape model including the shape and a direction of the main body, the protruding section model including the positions and the number of the protruding sections, a feature of the distal end portion, and the insertion section model including positions, the number, and sizes of the insertion sections.

In this image processing method, similarly to the above-described image processing device, it is possible to obtain a captured image in which the protruding section can be more reliably detected by multiple lighting modes without requiring a special lighting section or an imaging section, and it is possible to image the main body and the protruding section at once. Therefore, in this image processing method, when mounting a component having a protruding section protruding from the main body, it is possible to perform the mounting process more reliably with a simpler configuration. In this image processing method, various aspects of the above-described image processing device may be adopted, or steps for realizing the functions of the above-described image processing device may be added.

The mounting method of the present disclosure is amounting method executed by a mounting device including a mounting section configured to insert one or more protruding sections of a component, which includes a main body and the protruding sections formed on the main body, into insertion sections formed on a processing target object to dispose the component on the processing target object, a lighting section configured to turn on side lighting for irradiating the component with light from side and vertical lighting for irradiating the component with light from below, and an imaging section configured to have at least a depth of field of a distance between the main body and the protruding section and image the component from below, the method including:

(e) a step of acquiring a captured image obtained by imaging the component picked up by the mounting section by using the lighting used in the component model generated in the above-described image processing method, and (f) a step of detecting the shape of the main body, the positions of the protruding sections, the number of the protruding sections, and a distal end portion of the protruding section from the acquired captured image and causing the mounting section to dispose the component on the processing target object by using the component model.

In this mounting method, the shape of the main body, the positions of the protruding sections, the number of the protruding sections, and the distal end portion of the protruding section are detected from a captured image acquired by using the lighting used in the component model generated by any of the above-described image processing devices. In this mounting method, a component model is used to cause the mounting section to dispose a component on a processing target object. Accordingly, in this mounting method, when mounting a component having a protruding section protruding from the main body, it is possible to perform the mounting process more reliably with a simpler configuration. In addition, it is possible to obtain an effect corresponding to the aspect of the adopted image processing method. In this mounting method, various aspects of the above-described mounting device may be adopted, or steps for achieving each function of the above-described mounting device may be added.

INDUSTRIAL APPLICABILITY

The image processing device, the mounting device, the mounting system, and the image processing method of the present disclosure can be used, for example, in a field of mounting electronic components.

REFERENCE SIGNS LIST

10, 10B: mounting system, 11, 11B: mounting device, 12, 12B: conveyance device, 13: conveyance section, 14: imaging unit, 15: imaging section, 16: lighting section, 17: side lamp, 18: vertical lamp, 20, 20B: mounting section, 21: articulated arm robot, 21B: mounting head, 22, 22B: pickup member, 23: camera, 24: head moving section, 25, 25B: supply device, 26: supply placement section, 27: exciting section, 28: component supply section, 29: feeder, 30: processing target object, 30B: board, 31: component, 32: main body, 33: protruding section, 34: taper portion, 35: distal end portion, 40: control device, 41: CPU, 42: storage section, 43: component model, 44: contour shape model, 45: protruding section model, 46: insertion section model, 47: display device, 48: input device, 51: component image, 52: main body, 53: protruding section, 55: distal end portion, 56: insertion section, 60: management device, A: protruding section region

The invention claimed is:

1. An image processing device for use in a mounting device including a mounting section configured to insert protruding sections of a component, which includes a main body and the protruding sections formed on the main body, into insertion sections formed on a processing target object to dispose the component on the processing target object, the image processing device comprising:

an image control section configured to acquire a captured image obtained by imaging the component by at least one of a side lighting and a vertical lighting of an imaging unit including a lighting section and an imaging section, the lighting section being configured to turn on the side lighting for irradiating the component with a light from a side of the component and the vertical lighting for irradiating the component with a light from below the component, and the imaging section being configured to have at least a depth of field of a distance between the main body and the protruding sections and image the component from below the component, detect a shape of the main body, positions of the protruding sections, a number of the protruding sections, and a distal end portion of each of the protruding sections from the acquired captured image, acquire information of the insertion sections, and generate a component model including a contour shape model and a protruding section model, the contour shape model including the shape and a direction of the main body, and the protruding section model including the positions and the number of the protruding sections, and a feature of the distal end portion of each of the protruding sections.

2. The image processing device according to claim 1, wherein the image control section generates the component model further including an insertion section model from the information of the insertion sections, the insertion section model including positions, the number, and sizes of the insertion sections.

3. A mounting device comprising:

a mounting section configured to insert protruding sections of a component, which includes a main body and the protruding sections formed on the main body, into insertion sections formed on a processing target object to dispose the component on the processing target object;

a lighting section configured to turn on a side lighting for irradiating the component with a light from a side of the component and a vertical lighting for irradiating the component with a light from below the component;

an imaging section configured to have at least a depth of field of a distance between the main body and the protruding sections and image the component from below; and a mounting control section configured to use lighting used in the component model generated by the image processing device according to claim 1 to detect the shape of the main body, the positions of the protruding sections, the number of the protruding sections, and the distal end portion of each of the protruding sections from the captured image obtained by imaging the component picked up by the mounting section, and causes the mounting section to dispose the component on the processing target object by using the component model generated by the image processing device.

4. The mounting device according to claim 3, wherein the mounting control section determines whether the component can be disposed on the processing target object by using the component model.

5. The mounting device according to claim 3, wherein the mounting control section determines whether one of the protruding sections interferes with one of the insertion sections when the one of the protruding sections is inserted into the one of the insertion sections at least assuming the insertion sections having a first size and a second size smaller than the first size, by using an insertion section model.

6. The mounting device according to claim 3, wherein the mounting control section executes a parallax correction on the captured image with an image center as a reference, and detects the positions of the protruding sections.

7. The mounting device according to claim 6, wherein the mounting control section executes the parallax correction of $Rp-Ru\times PL$ when a resolution per pixel of the distal end portion of one of the protruding sections is defined as Rp, a unit resolution that is a resolution change amount per predetermined length is defined as Ru, and a length of the one of the protruding sections from the main body is defined as PL.

8. A mounting system comprising:

the mounting device according to claim 3; and a supply device configured to supply the component to a placement region in an indefinite direction, wherein the mounting section includes an articulated arm robot.

9. An image processing method used by a mounting device including a mounting section configured to insert protruding sections of a component, which includes a main body and the protruding sections formed on the main body, into insertion sections formed on a processing target object to dispose the component on the processing target object, the method comprising:

(a) a step of acquiring a captured image obtained by imaging the component by at least one of a side lighting and a vertical lighting of an imaging unit including a lighting section and an imaging section, the lighting section being configured to turn on the side lighting for irradiating the component with a light from a side of the component and the vertical lighting for irradiating the component with a light from below the component, and the imaging section being configured to have at least a depth of field of a distance between the main body and the protruding sections and image the component from below the component;

(b) a step of detecting a shape of the main body, positions of the protruding sections, a number of the protruding sections, and a distal end portion of each of the protruding sections from the acquired captured image;

(c) a step of acquiring information of the insertion sections; and (d) a step of generating a component model including a contour shape model, a protruding section model, and an insertion section model, based on the detection result of the step (b) and the information acquired in the step (c), the contour shape model including the shape and a direction of the main body, the protruding section model including the positions and the number of the protruding sections, and a feature of the distal end portion of each of the protruding sections, and the insertion section model including the positions, the number, and sizes of the insertion sections.

10. A mounting method executed by a mounting device including a mounting section configured to insert protruding sections of a component, which includes a main body and the protruding sections formed on the main body, into insertion sections formed on a processing target object to dispose the component on the processing target object, a lighting section configured to turn on a side lighting for irradiating the component with a light from a side of the component and a vertical lighting for irradiating the component with a light from below the component, and an imaging section configured to have at least a depth of field of a distance between the main body and the protruding sections and image the component from below the component, the method comprising:

(e) a step of acquiring a captured image obtained by imaging the component picked up by the mounting section by using the lighting used in the component model generated in the image processing method according to claim 9; and (f) a step of detecting the shape of the main body, the positions of the protruding sections, the number of the protruding sections, and the distal end portion of each of the protruding sections from the acquired captured image and causing the mounting section to dispose the component on the processing target object by using the component model.

* * * * *